(12) United States Patent
Ito (10) Patent No.: US 8,199,514 B2
(45) Date of Patent: Jun. 12, 2012

(54) CONTAINER UNIT FOR ELECTRICAL DEVICE

(75) Inventor: Yoshinobu Ito, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 862 days.

(21) Appl. No.: 12/285,104

(22) Filed: Sep. 29, 2008

(65) Prior Publication Data

US 2009/0296356 A1 Dec. 3, 2009

(30) Foreign Application Priority Data

Sep. 28, 2007 (JP) ................................ 2007-253334

(51) Int. Cl.
*H05K 5/00* (2006.01)

(52) U.S. Cl. .......... 361/752; 361/748; 361/829; 74/335; 74/336 R; 74/473.12

(58) Field of Classification Search .................... 361/752
See application file for complete search history.

(56) References Cited

U.S. PATENT DOCUMENTS

| | | | | |
|---|---|---|---|---|
| 5,253,143 A * | 10/1993 | Klinger et al. | ................ | 361/736 |
| 5,473,109 A * | 12/1995 | Plankl et al. | ................... | 174/363 |
| 5,761,046 A * | 6/1998 | Hein et al. | ..................... | 361/752 |
| 6,021,368 A * | 2/2000 | Taniguchi et al. | .............. | 701/51 |
| 6,144,273 A * | 11/2000 | Satoh et al. | .................... | 335/207 |
| 6,154,107 A * | 11/2000 | Tomotoshi | ..................... | 335/205 |
| 6,407,925 B1 * | 6/2002 | Kobayashi et al. | ........... | 361/752 |
| 6,573,448 B2 * | 6/2003 | Mayer et al. | .................... | 174/481 |
| 6,690,582 B2 * | 2/2004 | Sumida | ......................... | 361/752 |
| 6,707,678 B2 * | 3/2004 | Kobayashi et al. | ........... | 361/752 |
| 6,816,381 B2 * | 11/2004 | Takeuchi | ....................... | 361/752 |
| 7,375,966 B2 * | 5/2008 | Murakami et al. | ............ | 361/707 |
| 7,679,923 B2 * | 3/2010 | Inagaki et al. | ................. | 361/752 |
| 2002/0032093 A1 * | 3/2002 | Kopec et al. | .................. | 475/114 |
| 2002/0105787 A1 * | 8/2002 | Kobayashi et al. | ........... | 361/752 |
| 2005/0028624 A1 * | 2/2005 | Murakami et al. | .............. | 74/335 |
| 2006/0007643 A1 | 1/2006 | Hirata et al. | | |
| 2007/0017310 A1 | 1/2007 | Matsuzaki et al. | | |
| 2009/0100954 A1 * | 4/2009 | Ito et al. | ...................... | 74/473.12 |
| 2009/0139362 A1 * | 6/2009 | Ito et al. | ...................... | 74/473.12 |

FOREIGN PATENT DOCUMENTS

| | | |
|---|---|---|
| JP | A-2006-008107 | 1/2006 |
| JP | A-2006-024620 | 1/2006 |
| JP | A-2007-010042 | 1/2007 |

* cited by examiner

*Primary Examiner* — Anthony Q Edwards
(74) *Attorney, Agent, or Firm* — Oliff & Berridge, PLC (57) ABSTRACT

An electrical device storage unit includes a separation wall having a convex portion and a concave portion; a control unit having a printed circuit board whose front surface and back surface are mounted with an electronic component; an adhesive for joining the convex portion and the printed circuit board; and an electrical device that is electrically connected with the control unit by a conductor and arranged opposite the control unit with the separation wall disposed therebetween, wherein the conductor is provided passing through the separation wall and the printed circuit board, and an end of the conductor is soldered to the printed circuit board.

10 Claims, 6 Drawing Sheets

CONTAINER UNIT FOR ELECTRICAL DEVICE

INCORPORATION BY REFERENCE

The disclosure of Japanese Patent Application No. 2007-253334 filed on Sep. 28, 2007 including the specification, drawings and abstract is incorporated herein by reference in its entirety.

BACKGROUND

The present invention relates to an electrical device storage unit.

An electrical device storage unit that includes a vehicle control system is described in Japanese Patent Application Publication No. JP-A-2007-10042. This vehicle control system integrates a shift-by-wire actuator serving as an electrical device and a shift-by-wire ECU (referred to as an SBW-ECU below) serving as a control unit. According to the vehicle control system, the shift-by-wire actuator and the SBW-ECU are stored in one case, which enables downsizing.

SUMMARY

However, in the vehicle control system described in Japanese Patent Application Publication No. JP-A-2007-10042, the shift-by-wire actuator and the SBW-ECU are not separated. As a consequence, a metallic foreign body generated from a gear component of the shift-by-wire actuator may adhere to a printed circuit board or electronic components of the SBW-ECU and cause a short-circuit in an electrical circuit.

The present invention was devised in light of the foregoing problem, and it is an object of the present invention to provide an electrical device storage unit capable of securing an electrical insulation property between an electrical device and a control unit. The present invention can also achieve various other advantages According to an exemplary aspect of the invention, an electrical device storage unit includes a separation wall having a convex portion and a concave portion; a control unit having a printed circuit board whose front surface and back surface are mounted with an electronic component; an adhesive for joining the convex portion and the printed circuit board; and an electrical device that is electrically connected with the control unit by a conductor and arranged opposite the control unit with the separation wall disposed therebetween, wherein the conductor is provided passing through the separation wall and the printed circuit board, and an end of the conductor is soldered to the printed circuit board.

According to an exemplary aspect of the invention, an electrical device storage unit includes a separation wall having a convex portion and a concave portion; a control unit having a printed circuit board whose front surface and back surface are mounted with an electronic component; and an electrical device that is electrically connected with the control unit by a conductor and arranged opposite the control unit with the separation wall disposed therebetween, wherein: the conductor is provided passing through the separation wall and the printed circuit board, and the control unit and the electrical device are separated from each other such that foreign material that is generated by the electrical device does not adhere to the printed circuit board or the electronic component.

BRIEF DESCRIPTION OF THE DRAWINGS

Various exemplary aspects of the invention will be described with reference to the drawings, wherein.

DETAILED DESCRIPTION OF EMBODIMENTS

Figure 1:
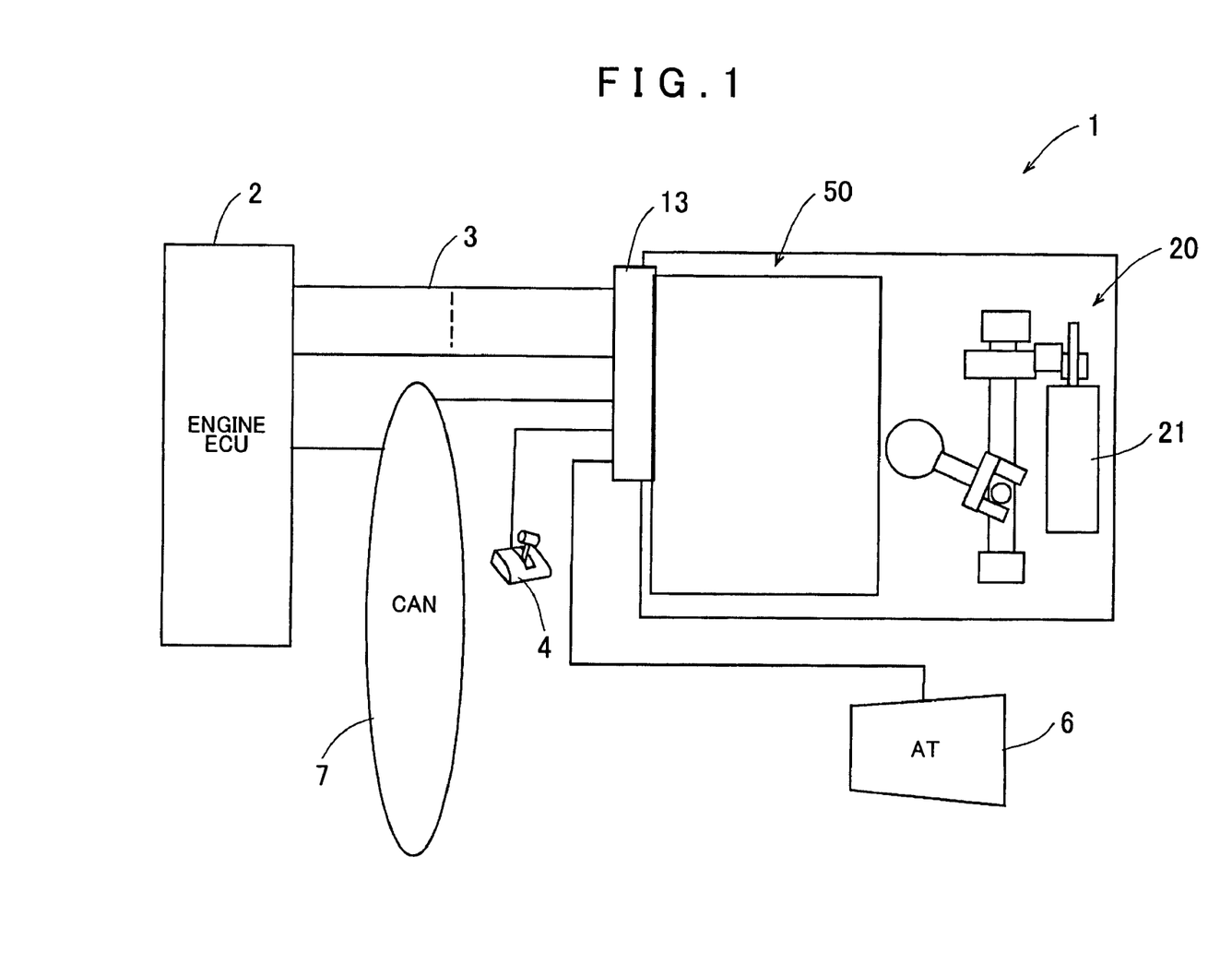
FIG. 1 is an electrical connection diagram of a shift-by-wire system according to an embodiment.

An embodiment that realizes an electrical device storage unit according to the present invention in a shift-by-wire system will be described below with reference to the accompanying drawings. As FIG. 1 shows, a shift-by-wire device system 1 serving as the electrical device storage unit of the embodiment is connected to an engine ECU 2 by a harness 3 via a connector 13, and also connected to a shift lever 4 and an automatic transmission 6. Here, the engine ECU 2 controls an engine, and the shift lever 4 is operated by a driver in order to set a travel range of the automatic transmission 6 to a desired range. The automatic transmission 6 automatically changes a transmission gear ratio in accordance with a vehicle speed and an engine speed. The shift-by-wire system 1 and the engine ECU 2 are connected by an onboard communication system CAN (Controller Area Network) 7 for example, and are capable of communicating with one another.

The shift-by-wire system 1 is provided with an actuator 20 and a control unit 50. The actuator 20 is provided with a motor 21 that changes a travel range (such as P, R, N, D, D1, and D2) of the automatic transmission 6, while the control unit 50 includes one printed circuit board 51 mounted with a shift-by-wire ECU (referred to as an SBW-ECU below) 53, an automatic transmission ECU (referred to as an AT-ECU below) 56, and the like as will be explained later (see FIG. 4).

Figure 2:
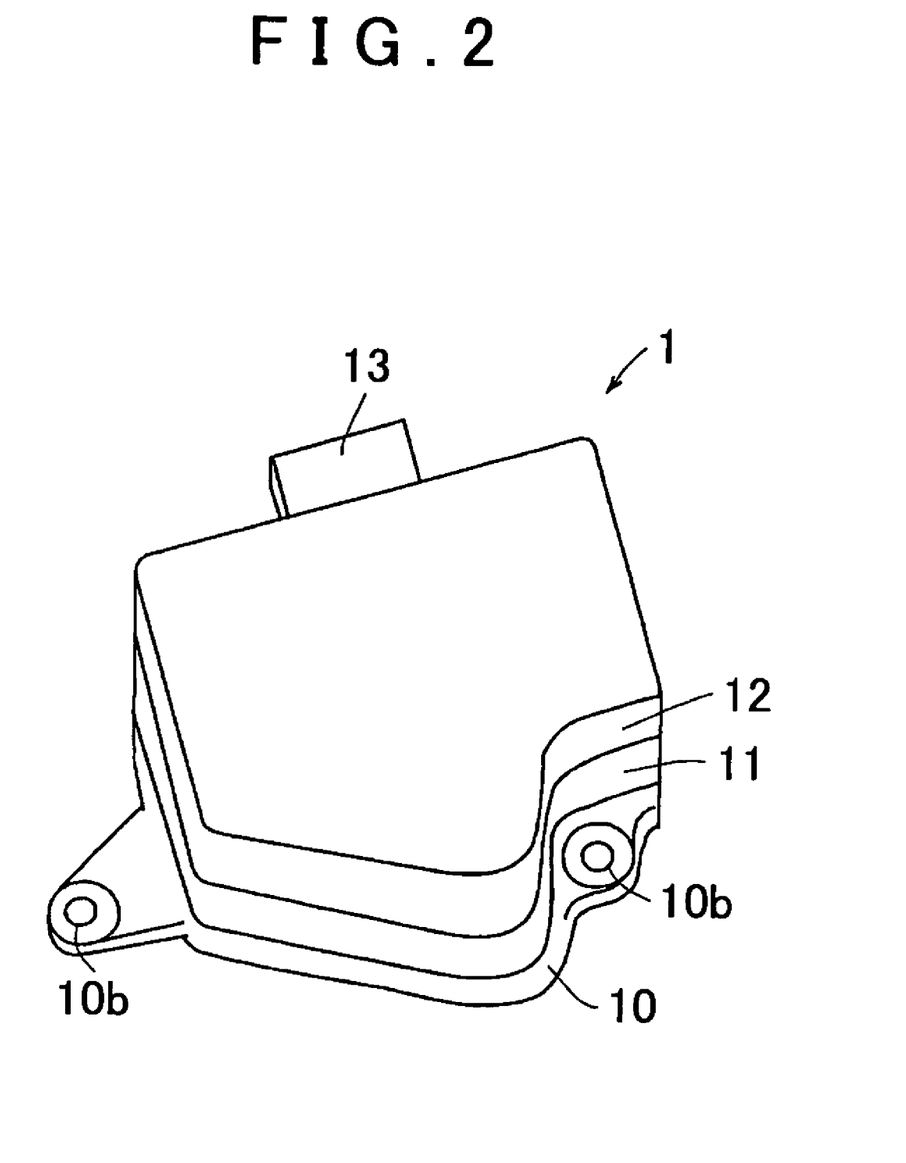
FIG. 2 is a perspective view of the shift-by-wire system according to the embodiment.

FIG. 2 is a view showing an outer appearance of the shift-by-wire system 1. A case of the shift-by-wire system 1 is structured from a case body 10 made of metal, an inner lid 11 made of resin, and a top lid 12 made of metal. The inner lid 11 is formed integrated with the connector 13. The shift-by-wire system 1 is fixed by a bolt to a case of the automatic transmission 6 using an attachment hole 10b provided in the case body 10, and thereby fixed to the case of the automatic transmission 6. Note that the case body 10 may instead be made of resin.

Figure 3:
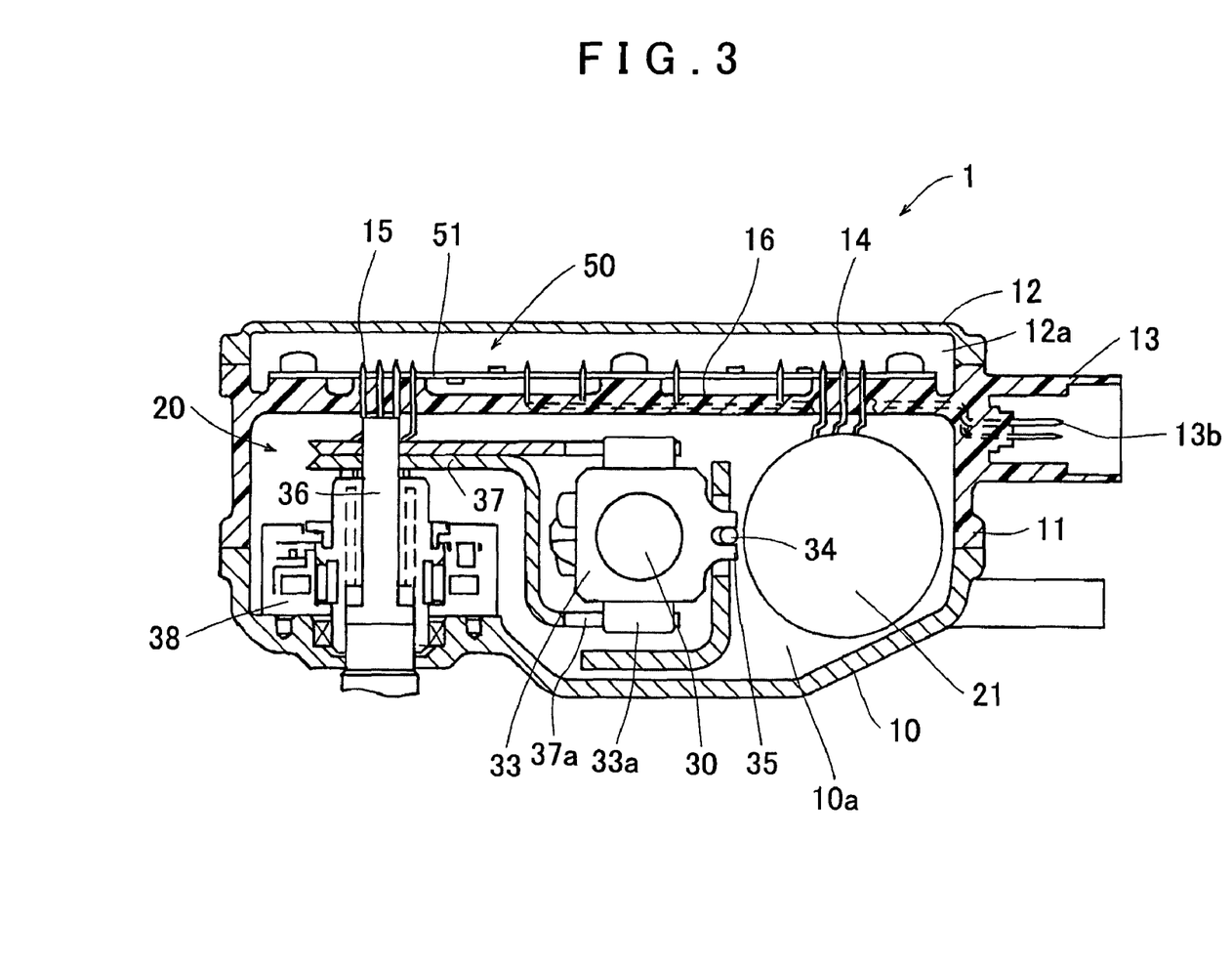
FIG. 3 is a cross-sectional view of the shift-by-wire system according to the embodiment.

FIG. 3 is a cross-sectional view of the shift-by-wire system 1. The shift-by-wire system 1 is provided with one case structured from the case body 10, the inner lid 11, and the top lid 12, and also provided with the actuator 20 and the control unit 50 accommodated within the case. Provided on the inner lid 11 is a separation wall 16 with a plate shape that forms a lower space 10a serving as a second space with the case body 10. The actuator 20 and a position sensor 38 are accommodated within the lower space 10a by fixing the actuator 20 and the position sensor 38 to the case body 10 and the inner lid 11 through adhesion with an adhesive or using a fixing device such as a screw. By covering the inner lid 11 with the top lid 12, an upper space 12a serving as a first space is formed between the inner lid 11 and the top lid 12, and the control unit 50 is accommodated within the upper space 12a. Note that the top lid 12 may instead be made of resin, and the inner lid 11 and the top lid 12 are fixed by screws, adhesion, vibration welding, or the like.

Figure 4:
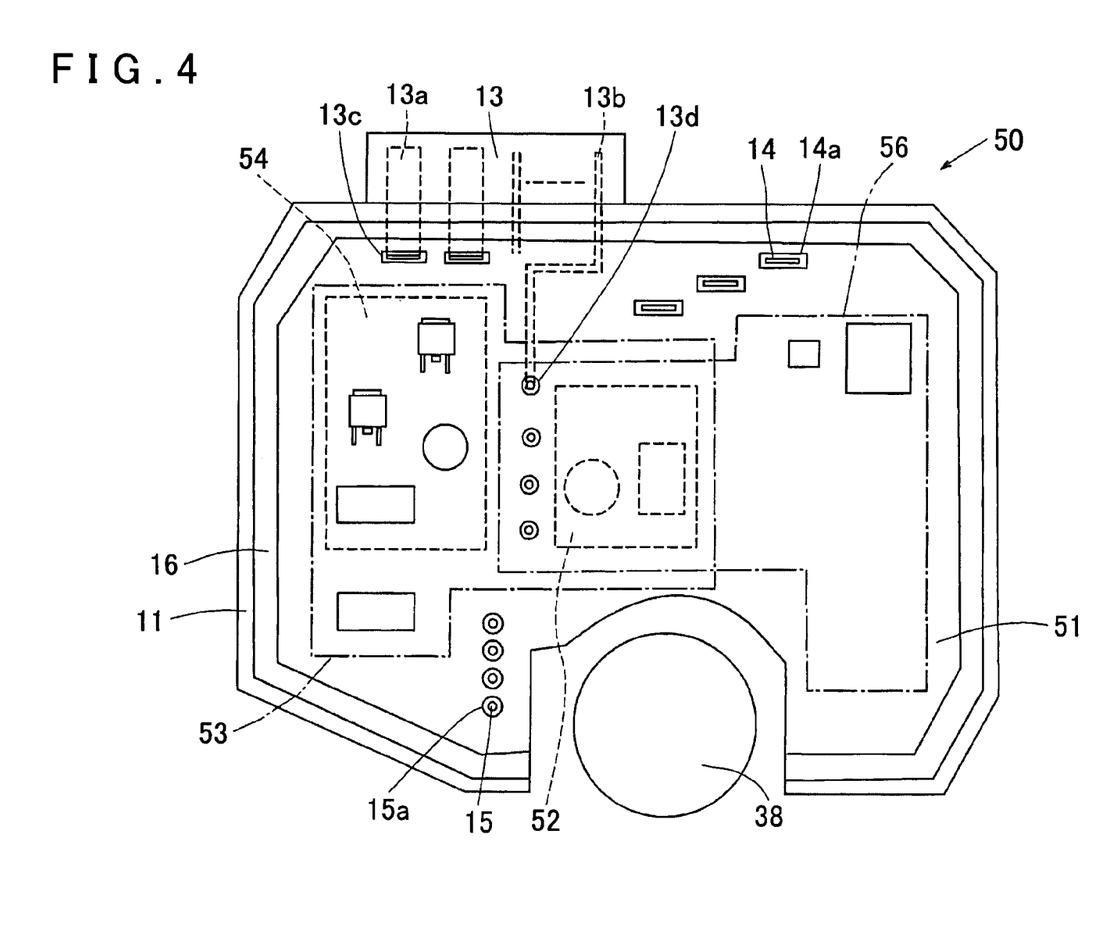
FIG. 4 is a frontal view of a control unit and an inner lid according to the shift-by-wire system of the embodiment.

FIG. 4 is a frontal view of the control unit 50 and the inner lid 11 with the top lid 12 removed. The control unit 50 includes the printed circuit board 51 mounted with electronic components structuring the SBW-ECU 53 and the AT-ECU 56. The printed circuit board 51 is threadedly fixed on the separation wall 16 of the inner lid 11. The SBW-ECU 53 and the AT-ECU 56 share a power circuit 52, and the SBW-ECU 53 includes a motor drive circuit 54. Here, the SBW-ECU 53 drives the actuator 20 based on a required range selected by the driver. By controlling various valves of a hydraulic control device of the automatic transmission 6 based on information such as an operating state of the engine as input from the engine ECU 2, the AT-ECU 56 changes an engagement state of clutches and brakes in order to change a shift state. Furthermore, the power circuit 52 stabilizes a power voltage at a predetermined voltage, which is then supplied to other circuits of the SBW-ECU 53 and the AT-ECU 56. The motor drive circuit 54 supplies a motor drive current to the motor 21.

As FIGS. 3 and 4 show, an end of the inner lid 11 is formed integrated with the connector 13, and the connector 13 is provided with a power terminal 13a and a signal terminal 13b. The connector 13 is internally divided among each of the engine ECU 2, the shift lever 4, the automatic transmission 6, and the CAN 7, and electrically connectable with these. The power terminal 13a supplies power to the power circuit 52. An end of the power terminal 13a projects into the connector 13 and passes through the inside of the inner lid 11 (the separation wall 16), while another end bent into an L shape projects upward from the separation wall 16 and is soldered to a land 13c of the printed circuit board 51. The power terminal 13a is connected with an IC of the power circuit 52 via a pattern connected with the land 13c. The signal terminal 13b transfers signals from sensors and commands or the like from the AT-ECU 56. An end of the signal terminal 13b projects into the connector 13 and passes through the inside of the inner lid 11 (the separation wall 16), while another end bent into an L shape projects upward from the separation wall 16 and is soldered to a land 13d of the printed circuit board 51. The signal terminal 13b is connected with the SBW-ECU 53 and the AT-ECU 56 via a pattern connected with the land 13d. In this manner, an electrical insulation property is secured by passing the power terminal 13a and the signal terminal 13b through the inside of the inner lid 11 (the separation wall 16).

A bus bar 14 conducts the motor drive current, and an end of the bus bar 14 is soldered to a land 14a of the printed circuit board 51 that is connected with an IC of the motor drive circuit 54. In addition, the bus bar 14 passes through the inside of the separation wall 16, and another end of the bus bar 14 projects downward from the separation wall 16 and is connected with the motor 21 of the actuator 20. A signal conducting wire 15 transfers a signal detected by the position sensor 38 to the SBW-ECU 53, and an end of the signal conducting wire 15 is soldered to a land 15a of the printed circuit board 51 that is connected with an IC of the SBW-ECU 53. In addition, the signal conducting wire 15 passes through the inside of the separation wall 16, and another end of the signal conducting wire 15 projects downward from the separation wall 16 and is connected with the position sensor 38. Here, the bus bar 14 and the signal conducting wire 15 are conductors.

The state in which the bus bar 14 and the signal conducting wire 15 are connected with the printed circuit board 51 will be described in detail based on FIGS. 5 and 6. The printed circuit board 51 is mounted with a plurality of electronic components 57. The separation wall 16 is formed with a plurality of convex portions 16a and concave portions 16d, with an upper surface of the convex portion 16a and a lower surface of the printed circuit board 51 joined by an adhesive 17. Accordingly, the concave portion 16d of the printed circuit board 51 accommodates some of the electronic components 57.

Figure 5:
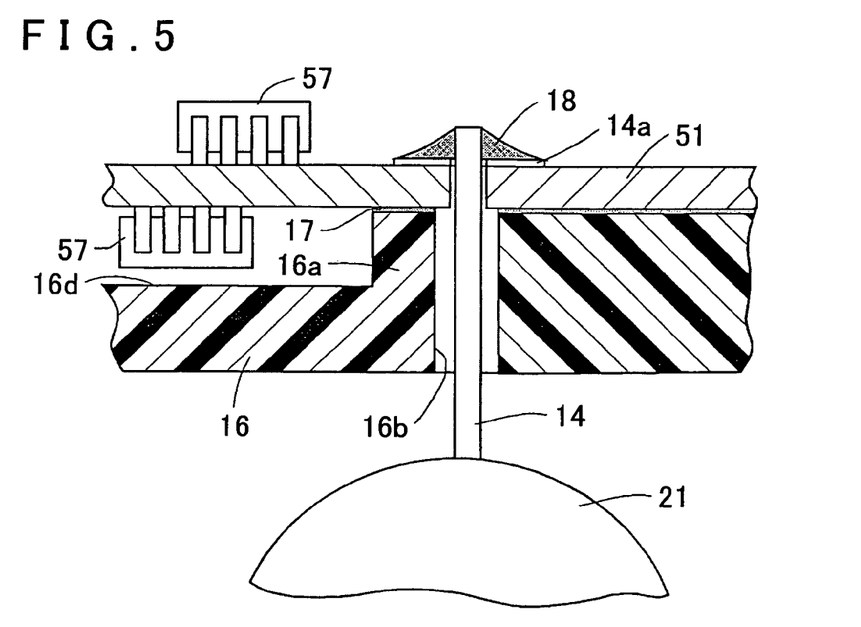
FIG. 5 is an expanded view of a bus bar, a printed circuit board, and a separation wall according to the shift-by-wire system of the embodiment.

As FIG. 5 shows, a through hole 16b with an oblong cross section is provided passing through the convex portion 16a (the separation wall 16). The bus bar 14 of the motor 21 passes through the inside of the through hole 16b. An end of the bus bar 14 passes through the printed circuit board 51 and is soldered by a solder 18 to the land 14a provided on an upper surface of the printed circuit board 51. Since the bus bar 14 is connected to the printed circuit board 51 through such a structure, even if a metallic foreign body generated from the shift-by-wire actuator 20 or the position sensor 38 enters the through hole 16b, the convex portion 16a and the printed circuit board 51 joined together by the adhesive 17 can prevent the metallic foreign body from entering to a lower surface of the printed circuit board 51. In addition, since the upper surface of the printed circuit board 51 is closed off by the solder 18, it is possible to prevent a metallic foreign body from exiting to the upper surface of the printed circuit board 51.

Figure 6:
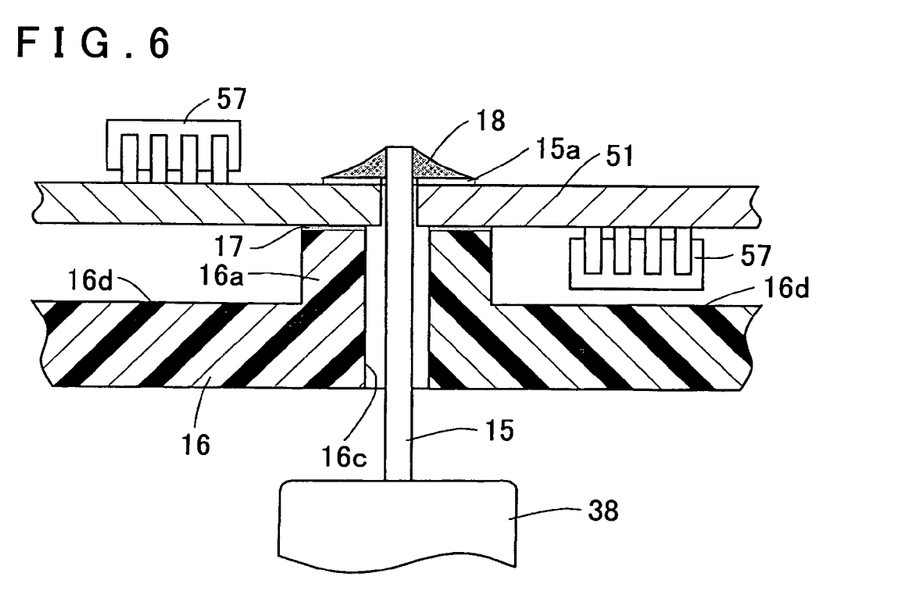
FIG. 6 is an expanded view of a signal conducting wire, the printed circuit board, and the separation wall according to the shift-by-wire system of the embodiment.

As FIG. 6 shows, a through hole 16c with an circular cross section is provided passing through the convex portion 16a (the separation wall 16). The signal terminal 15 of the position sensor 38 passes through the inside of the through hole 16c. An end of the signal terminal 15 passes through the printed circuit board 51 and is soldered by a solder 18 to the land 15a provided on an upper surface of the printed circuit board 51. Since the signal terminal 15 is connected to the printed circuit board 51 through such a structure, even if a metallic foreign body generated from the shift-by-wire actuator 20 or the position sensor 38 enters the through hole 16c, the convex portion 16a and the printed circuit board 51 joined together by the adhesive 17 can prevent the metallic foreign body from entering to a lower surface of the printed circuit board 51. In addition, since the upper surface of the printed circuit board 51 is closed off by the solder 18, it is possible to prevent a metallic foreign body from exiting to the upper surface of the printed circuit board 51.

Figure 7:
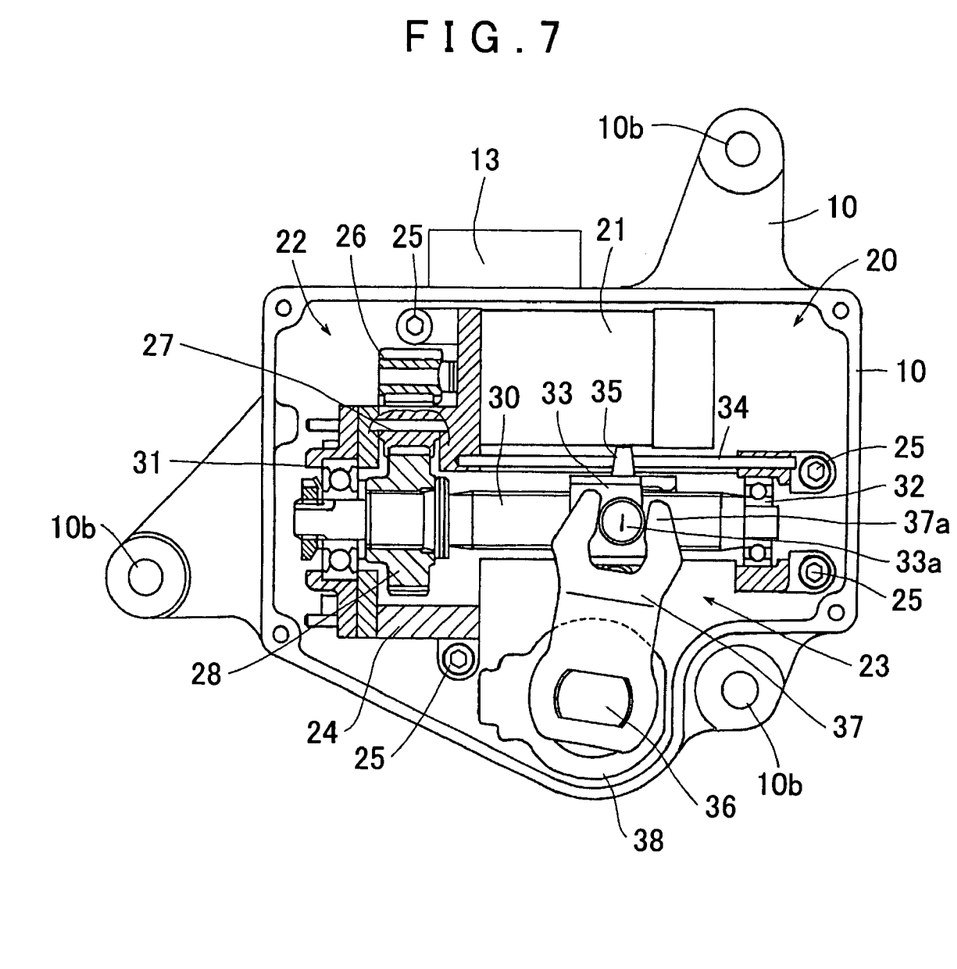
FIG. 7 is a frontal view of a shift-by-wire actuator according to the shift-by-wire system of the embodiment.

FIG. 7 is a frontal view of the actuator 20 and the position sensor 38 with the top lid 12 and the inner lid 11 removed. As also shown in FIG. 3, the actuator 20 and the position sensor 38 are accommodated within the lower space 10a formed by the case body 10 and the inner lid 11 having the separation wall 16. The actuator 20 is structured from the motor 21, a reduction mechanism 22, a motion conversion mechanism 23, and the like. Reference numeral 24 denotes a main bracket made of metal separate from the case body 10 which, after attachment to the motor 21, the reduction mechanism 22, the motion conversion mechanism 23, and the like, is fixed to the case body 10 by four bolts 25. The motor 21 is fixed to the main bracket 24, and an output shaft of the motor 21 passes through the main bracket 24 to project forward with a small gear 26 fitted to a distal end portion thereof. The motor 21 is a three-phase brushless motor, and is attached with a sensor that sends a pulse signal each time the output shaft rotates a unit angle. The motor 21 used is compact so as to enable storage within the case body 10.

Inside the case body 10, a ball screw shaft 30 is arranged parallel to the motor 21 and both ends of the ball screw shaft 30 are rotatably and axially supported on the main bracket 24 via bearings 31, 32. A front end side of the ball screw shaft 30 is fixed with a large gear 28 that meshes via the small gear 26 and an intermediate gear 27. The small gear 26, the intermediate gear 27, and the large gear 28 structure the reduction mechanism 22. Note that in the present embodiment, the rotation of the motor 21 decelerated by the small gear 26, the intermediate gear 27, and the large gear 28 is transferred to the ball screw shaft 30. However, the rotation of the motor 21 may be decelerated by a planetary gear, a worm gear, or the like, and then transferred to the ball screw shaft 30.

The ball screw shaft 30 is threadedly engaged with a ball nut 33. Both ends of an engagement rod 34 that extends parallel to the ball screw shaft 30 are fitted to the main bracket 24. A C-shaped engagement portion 35 that protrudes toward an outer periphery of the ball nut 33 is engaged with the engagement rod 34, and the ball nut 33 is held movable in an axial direction with respect to the main bracket 24. Thus, rotation of the motor 21 is decelerated by the reduction mechanism 22 and transferred to the ball screw shaft 30, and rotation of the ball screw shaft 30 is converted into axial motion of the ball nut 33 by the ball screw shaft 30, the ball nut 33, and the like.

An end of a pivot shaft 36 projects inside the lower space 10a and is rotatably supported on the case body 10. A base end portion of an arm 37 is fitted to the pivot shaft 36 with a relative rotation of the arm 37 thus regulated and the arm 37 supported capable of oscillation. A distal end of the arm 37 branches into two and extends toward both sides of the ball nut 33, where respective concave portions 37a are formed on the distal ends. Through engagement of the concave portions 37a with an engagement shaft 33a provided extending toward both sides of the ball nut 33, the arm 37 is engaged with relative movement thereof in the axial direction of the ball screw shaft 30 regulated. The ball screw shaft 30, the ball nut 33, the arm 37, the engagement shaft 33a, the concave portion 37a, and the like structure the motion conversion mechanism 23. In addition, an end of the pivot shaft 36 is attached with the position sensor 38. Note that an end of the pivot shaft 36 is connected with a range changeover mechanism (not shown) subject to driving by the actuator 20.

A description follows below regarding an operation of the SBW-ECU 53 and the actuator 20 in the shift-by-wire system 1 with the above structure. When the driver operates the shift lever 4, a shift signal based on the required range selected is input to the SBW-ECU 53 via the signal terminal 13b of the connector 13. A motor drive current based on the shift signal is then supplied from the SBW-ECU 53 to the motor 21 via the bus bar 14.

Accordingly, the motor 21 is driven in a predetermined driving direction, and rotational motion of the output shaft of the motor 21 is decelerated by the reduction mechanism 22 and transferred to the ball screw shaft 30 supported on the main bracket 24. Rotation of the ball screw shaft 30 moves the ball nut 33, whose rotation is regulated by engagement of the engagement rod 39 and the engagement portion 35, in the axial direction to thus rotate the arm 37 around the pivot shaft 36. The range changeover mechanism is changed by rotation of the pivot shaft 36.

The SBW-ECU 53 stops rotation of the motor 21 when an output voltage of the position sensor 38 reaches a predetermined value. Stopping rotation of the motor 21 changes the travel range of the automatic transmission 6.

Actions of the AT-ECU 56 will be outlined next. The AT-ECU 56 is input with information indicating an operation state such as the engine speed from the engine ECU 2 via the signal terminal 13b of the connector 13. Based on such information, the AT-ECU 56 outputs to the automatic transmission 6 a control signal that controls various valves of the hydraulic control device of the automatic transmission 6. The engagement states of the clutches and brakes are thus changed to change the shift state.

In the shift-by-wire system 1 according to the embodiment, the control unit 50 having the printed circuit board 51 whose front surface and back surface are mounted with the electronic component 57, and the motor 21 and the position sensor 38 electrically connected to the control unit 50 by the bus bar 14 and the signal conducting wire 15 are arranged with the separation wall 16 disposed therebetween. The printed circuit board 51 of the control unit 50 and the convex portion 16a of the separation wall 16 are adhered together; and the ends of the bus bar 14 and the signal conducting wire 15, which are provided passing through the separation wall 16 and the printed circuit board 51, are soldered to the printed circuit board 51. The motor 21 and the position sensor 38 are thus completely separated from the control unit 50. Consequently, even if a metallic foreign body is generated from the motor 21 or the position sensor 38, the metallic foreign body does not adhere to the printed circuit board 51 or the electronic component 57 of the control unit 50, making it possible to prevent short-circuiting of an electrical circuit. Thus according to the shift-by-wire system 1, the control unit 50 can be electrically insulated from the motor 21 and the position sensor 38.

Also, according to the shift-by-wire system 1, the electrical component 57 mounted on the printed circuit board 51 is accommodated in the concave portion 16d of the separation wall 16. Therefore, space can be conserved to achieve overall downsizing of the shift-by-wire system 1.

Furthermore, the shift-by-wire system 1 has a case divided by the separation wall 16 into the upper space 12a and the lower space 10a, with the upper space 12a accommodating the control unit 50 and the lower space 10a accommodating the motor 21 and the position sensor 38. This contributes to more convenient handling of the shift-by-wire system 1.

In addition, since the bus bar 14 and the signal conducting wire 15 are embedded in the separation wall 16 in the shift-by-wire system 1, the bus bar 14 and the signal conducting wire 15 can be used in place of an internal layer pattern of the printed circuit board 51, which is advantageous as a countermeasure for noise and high current conduction.

Note that in the present embodiment, the first space is arranged above the second space. However, the second space may be placed above the first space instead or the first space arranged next to the second space. By forming many convex portions 16a to adhere to the lower surface of the printed circuit board 51, a screw for joining the printed circuit board 51 and the separation wall 16 can be eliminated. In addition, although the present embodiment uses the adhesive 17, other forms of adhesive such as a sheet or the like may be employed. A sheet that can be employed as an adhesive includes a polymer sheet having a thickness of approximately 5 to 10 mm, as well as heat resistance, low stress, and adhesiveness to a printed circuit board.

The integrated structure of electrical devices in the present invention was described in the context of an embodiment; however, the present invention is not limited to such, and may be applied with modification as appropriate provided that such modifications do not contradict the technical concept of the present invention.

The electrical device storage unit according to the present invention is suitable for use as an electrical device storage unit that stores in a separated state a control unit having a printed circuit board mounted with an electronic component and an electrical device that is electrically connected to the control unit, such as a motor for changing a travel range of a host vehicle to a desired range.

According to an exemplary aspect of the invention, a control unit having a printed circuit board whose front surface and back surface are mounted with an electronic component, and an electrical device electrically connected to the control unit by a conductor are arranged with a separation wall disposed therebetween. The printed circuit board of the control unit and the convex portion of the separation wall are adhered together; and an end of the conductor, which is provided passing through the separation wall and the printed circuit board, is soldered to the printed circuit board. The electrical device is thus completely separated from the control unit. Consequently, even if a metallic foreign body is generated from the electrical device, the metallic foreign body does not adhere to the printed circuit board or the electronic component of the control unit, making it possible to prevent short-circuiting of an electrical circuit. According to the electrical device storage unit, an electrical insulation property between the electrical device and the control unit can therefore be secured.

According to an exemplary aspect of the invention, the electrical component mounted on the printed circuit board is accommodated in the concave portion of the separation wall. Therefore, space can be conserved to achieve overall downsizing of the electrical device storage unit.

According to an exemplary aspect of the invention, the electrical device storage unit includes a case divided into a first space and a second space by the separation wall, wherein the first space accommodates the control unit, and the second space accommodates the electrical device. This contributes to more convenient handling of the electrical device storage unit.

According to an exemplary aspect of the invention, the electrical device is a sensor. Therefore, a sensor storage unit can be achieved.

According to an exemplary aspect of the invention, the electrical device is a motor. Therefore, a motor storage unit can be achieved.

According to an exemplary aspect of the invention, the motor is used in a shift-by-wire system. Therefore, a motor storage unit for a shift-by-wire system can be achieved.

According to an exemplary aspect of the invention, the conductor is embedded in the separation wall. Therefore, the conductor can be used in place of an internal layer pattern of the printed circuit board, which is advantageous as a countermeasure for noise and high current conduction.

The invention claimed is:

1. An electrical device storage unit comprising:
   a separation wall having a convex portion and a concave portion;
   a control unit having a printed circuit board whose front surface and back surface are mounted with an electronic component;
   an adhesive for joining the convex portion and the printed circuit board; and
   an electrical device that is electrically connected with the control unit by a conductor and arranged opposite the control unit with the separation wall disposed therebetween,
   wherein the conductor is provided passing through the separation wall and the printed circuit board, and an end of the conductor is soldered to the printed circuit board.

2. The electrical device storage unit according to claim 1, wherein the electronic component mounted on the printed circuit board is accommodated in the concave portion of the separation wall.

3. The electrical device storage unit according to claim 1, further comprising:
   a case divided into a first space and a second space by the separation wall,
   wherein the first space accommodates the control unit, and the second space accommodates the electrical device.

4. The electrical device storage unit according to claim 1, wherein the electrical device is a sensor.

5. The electrical device storage unit according to claim 1 wherein the electrical device is a motor.

6. The electrical device storage unit according to claim 5, wherein the motor is used in a shift-by-wire system.

7. The electrical device storage unit according to claim 1, wherein the conductor is embedded in the separation wall.

8. The electrical device storage unit according to claim 1, wherein the electrical device is a sensor and a motor.

9. The electrical device storage unit according to claim 8, wherein the conductor includes a bus bar that connects the printed circuit board and the motor and a wire that connects the printed circuit board and the sensor.

10. The electrical device storage unit according to claim 1, wherein the control unit is electrically insulated from the electrical device.

* * * * *